United States Patent [19]

Gregor et al.

[11] Patent Number: 5,354,955
[45] Date of Patent: Oct. 11, 1994

[54] DIRECT JUMP ENGINEERING CHANGE SYSTEM

[75] Inventors: Lawrence V. Gregor, Hopewell Junction; Michael F. McAllister, Clintondale, both of N.Y.

[73] Assignee: International Business Machines Corporation, Armonk, N.Y.

[21] Appl. No.: 984,608

[22] Filed: Dec. 2, 1992

[51] Int. Cl.$^5$ .............................................. H05K 1/00
[52] U.S. Cl. ................................. 174/250; 174/260; 174/262; 361/760; 361/767; 361/785
[58] Field of Search .............. 174/250, 260, 261, 262, 174/263, 264, 265, 266; 361/760, 767, 777, 784, 785

[56] References Cited

U.S. PATENT DOCUMENTS

| | | | |
|---|---|---|---|
| 4,489,364 | 12/1984 | Chance et al. ................. | 361/395 |
| 4,549,200 | 10/1985 | Ecker et al. .................... | 357/80 |
| 4,652,065 | 3/1987 | Cassinelli ....................... | 339/17 CF |
| 4,706,165 | 11/1987 | Takenaka et al. .............. | 361/403 |
| 4,803,595 | 2/1989 | Kraus et al. . | |
| 4,922,377 | 5/1990 | Matsumoto et al. ........... | 361/387 |
| 4,926,241 | 5/1990 | Carey ............................. | 357/75 |
| 5,036,163 | 7/1991 | Spielberger et al. ........... | 174/52.4 |
| 5,060,116 | 10/1991 | Grobman et al. .............. | 361/474 |
| 5,066,831 | 11/1991 | Spielberger et al. ........... | 174/52.4 |
| 5,243,140 | 9/1993 | Bhatia . | |
| 5,294,754 | 3/1994 | Wu . | |

Primary Examiner—Gerald P. Tolin
Assistant Examiner—Cheryl R. Figlin
Attorney, Agent, or Firm—Whitham, Curtis, Whitham & McGinn

[57] ABSTRACT

A multi-layer interposer in which the X-Y engineering change wiring pattern in the interposer terminates in a pattern of pads on the upper surface of the interposer around the periphery of the chip. In order to make an engineering change, a jumper wire connect pads on adjacent interposers mounted on the multi-chip module.

11 Claims, 5 Drawing Sheets

DIRECT JUMP ENGINEERING CHANGE SYSTEM

BACKGROUND OF THE INVENTION

1. Field of the Invention

This invention relates to an improved system to facilitate making engineering wiring changes among semiconductor chips supported on a common multi-layer substrate, and more particularly, to a chip interposer that facilitates the use of direct jumper wires for making engineering change connections.

2. Description of the Prior Art

As will be appreciated by those skilled in the art and, as explained in U.S. Pat. No. 4,803,595 assigned to the assignee of this application, current packaging technology mounts a number of integrated circuit chips on a common substrate that interconnects the chips with each other and to input/output pads.

Such substrates normally are constructed of layered ceramic sheets (so-called green sheets) having thousands of vias and printed wiring lines that form the internal circuit network. After the substrate has been laminated and sintered, there is no practical method of changing the buried internal network. However, it becomes necessary quite frequently to modify the internal circuitry to (1) correct defective lines and/or vias and (2) make changes in the basic circuitry to accommodate design changes, to upgrade the package, or modify it by the use of different devices or the like.

A number of engineering change (EC) schemes have been developed to modify the interconnection network between chips; i.e., to disrupt the unwanted part of a network and to substitute a replacement network part. In known schemes, the network disruptions and replacements are accomplished through the use of "fan-out" networks with or without EC pads that are physically located in spaces between the chips on the surface of the substrate on which the device chips are mounted.

There have also been proposals in the prior art to facilitate making engineering changes by means of a so-called interposer module. That is, a wiring module for each chip that is interposed between the chip and multi-chip module. Here, a chip is electrically and mechanically connected to the top surface of the interposer module by solder bumps and the lower surface of the interposer is similarly connected to the multi-chip module. Prior art interposer modules have wiring layers and via chains formed by the same, or similar technologies, that are used to manufacture the multi-chip module itself. The wiring layers of the interposer module provide wiring patterns that can be used to reroute connections in accordance with desired engineering changes including changes in the connections between chips on the module. Prior art technology for making engineering changes by rerouting connection paths is described in U.S. Pat. No. 4,489,363, also assigned to the assignee of this application. The aforementioned U.S. Pat. No. 4,803,595 discloses an exemplary prior art interposer.

SUMMARY OF THE INVENTION

An object of this invention is the provision of a multi-layer interposer that meets the needs of engineers and designers of multi-chip modules during the modules development stage; an interposer that provides each chip a large number of change pads for interconnection to adjacent chips.

Another object of the invention is the provision of an interposer provides programmable input/output pads and directional change locations at the periphery of the chip.

A further object of the invention is provision of an interposer that allows chip burn-in before the chip is mounted on the substrate and provides an interface for testing the chip prior to connection of the chip to the multi-chip module.

Briefly, this invention contemplates the provision of a multi-layer interposer which connects relevant chip pads to engineering change pads located around the periphery of the interposer. The engineering change pads are arranged in a repeating pattern around the periphery of the interposer, clear of the chip so that they are accessible on the top surface of the interposer. The interposer includes an X wiring pattern layer of closely spaced parallel conductors running in an "X" direction and a Y wiring pattern layer of closely spaced parallel conductors running in a "Y" direction. X-Y change pads connect X and Y conductors to X jumper wire pads and Y jumper wire pads. The X jumper wire pads are disposed along the outer periphery of the pattern and the X-Y change pads are interspersed in the pattern of engineering change pads. Similarly, the wiring pattern is connected to Y jumper wire pads and X-Y change pads disposed in a similar manner to the corresponding "Y" direction pads.

To make an engineering change, a jumper connects an appropriate engineering change pad to an X-Y change pad, which is always in close proximity to the engineering change pad because the X-Y change pads are interspersed regularly throughout the pattern of engineering change pads. The X-Y change pads are alterable at the surface of the interposer so as to make a connection to an X or Y jumper wire pad at a desired peripheral location so that only a short jumper wire is required to be connected to a proper jumper wire pad on an adjacent chip interposer. The jumper wire is used to connect the X or Y jumper wire pad on one interposed to an X or Y jumper wire pad on an adjacent interposer. It will be appreciated that engineering changes can be made in a similar manner confined to a single interposer and its associated chip.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
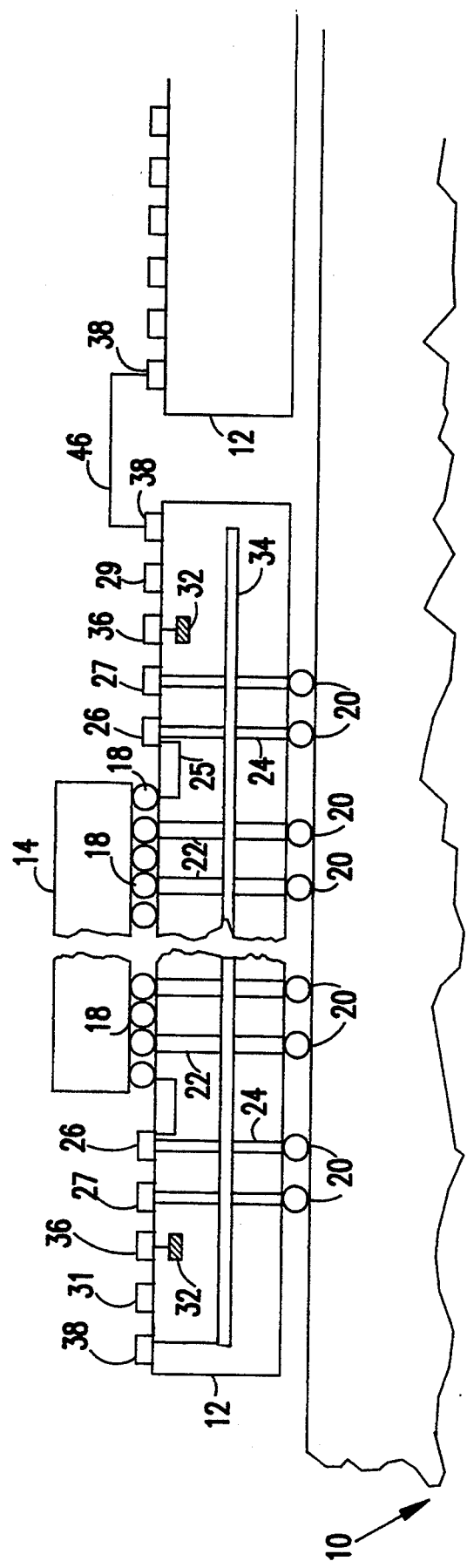
FIG. 1 is a sectional pictorial view illustrating one embodiment of an interposer in accordance with the teachings of this invention.
Figure 2:
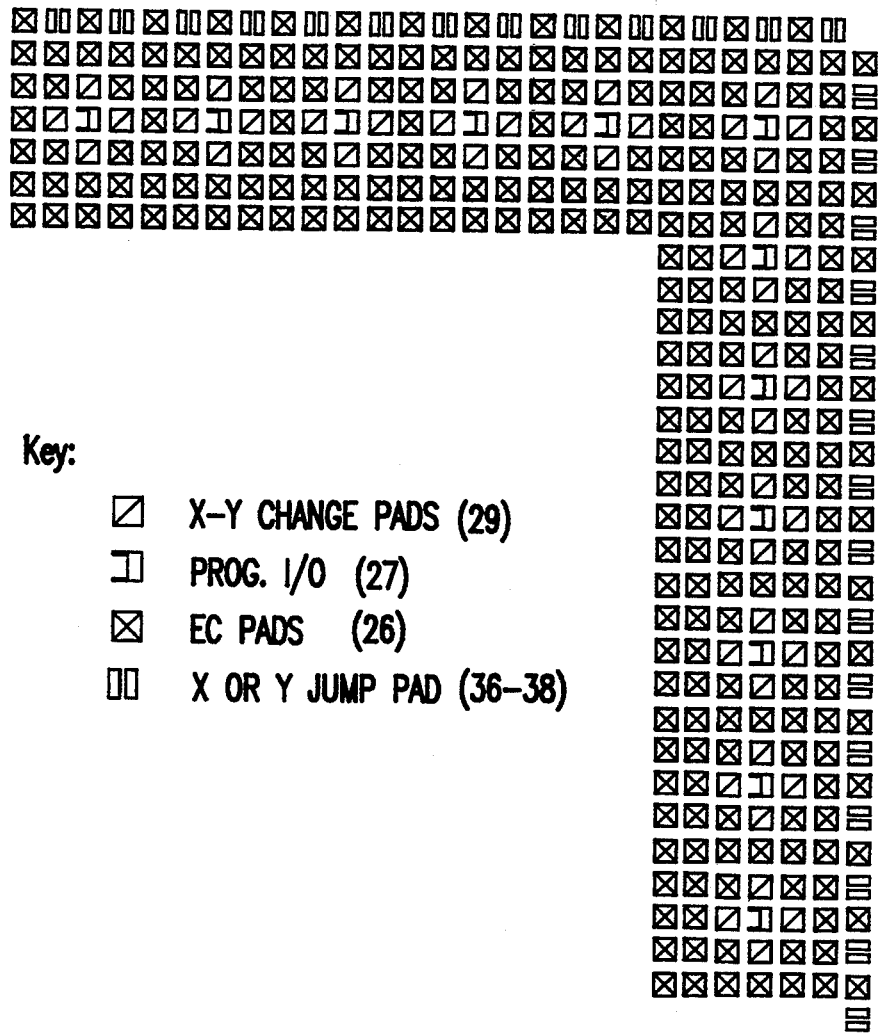
FIG. 2 illustrates the repeating peripheral pattern of surface pads on the interposer; pads for each specific function, such as engineering change pads, are each shown with an identifying mark.
Figure 3:
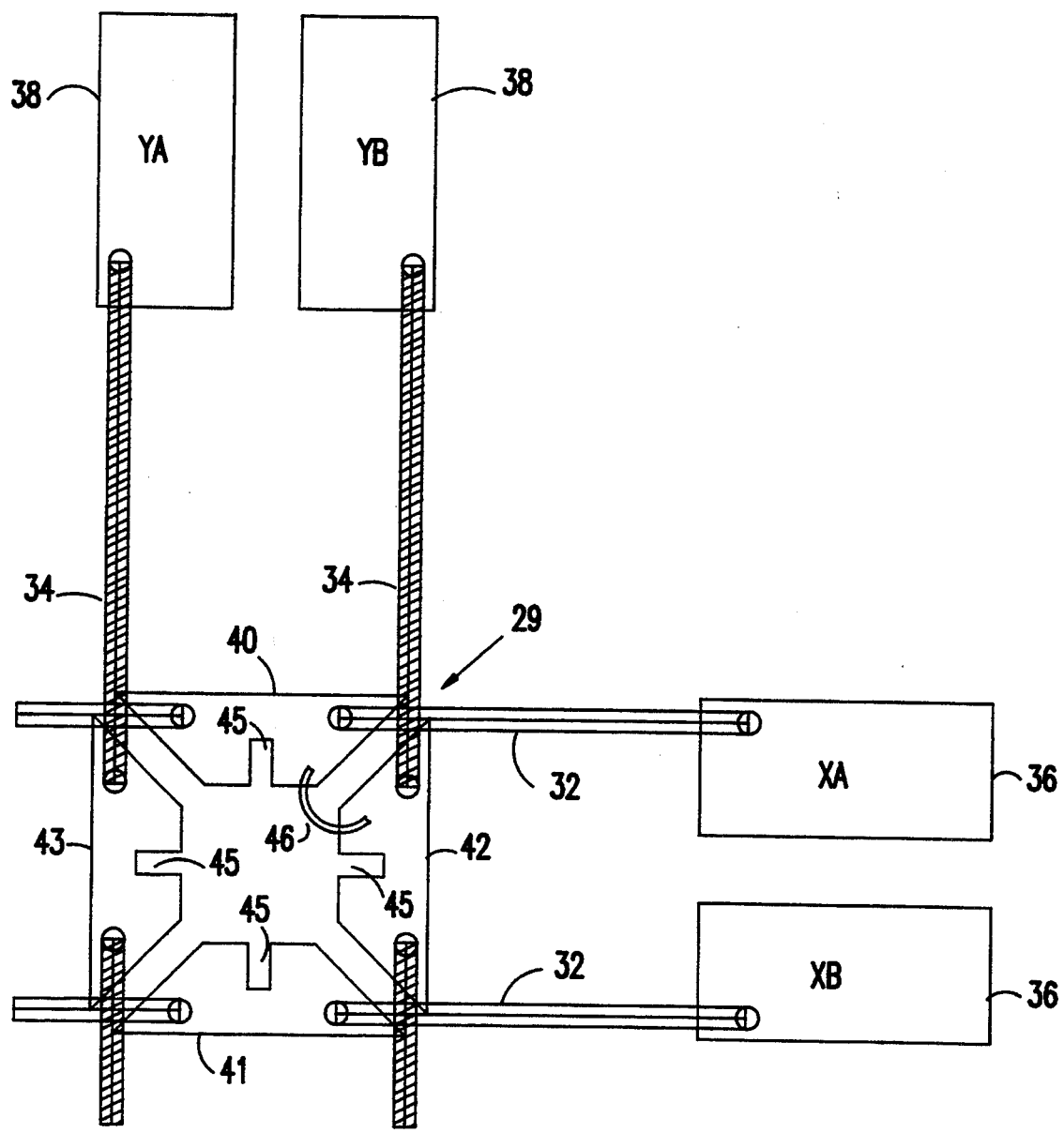
FIG. 3 is an enlarged plan view of an X-Y change pad.

Referring now to FIGS. 1, 2 and 3, a multi-layer, multi-chip module 10, which may be of a conventional prior art design, has mounted on its top surface a number of interposers 12, each carrying an integrated circuit chip 14; two interposers and chips are represented in FIG. 1. Each interposer 12 provides a redistribution of input/output pad locations and provides connection pads for engineering change jumper wire connections to adjacent chips. The interposer itself is a multi-layer structure similar in construction to the module. It has an X layer wiring pattern of closely spaced parallel conductors extending in an X direction and a similar Y layer wiring pattern. It will be appreciated that an interposer in accordance with the teachings of this invention is particularly useful during the development of a multi-chip module.

Solder bumps 18 electrically and mechanically connect each chip 14 to its interposer, and solder bumps 20 connect the interposer to the module 10. Via chains 22 in the interposer 12 connect the solder bumps 18 on the top surface of the interposer to the solder bumps 20 that connect the interposer to the module. Via chains 24 connect engineering input/output pads on the top surface of the module 10 to engineering input/output pads 26 on the top surface of the interposer 12.

As previously mentioned, the interposer is a multi-layer structure similar to the module itself. It has embedded X and Y wiring pattern layers represented by conductors 32 and 34, respectively, that allow rerouting of interconnection networks by means of which desired engineering changes can be executed. The X wire conductors 32 are connected to X jumper wire pads 36 on the top surface of the interposer at its outer periphery and the Y wire conductors 34 are connected to y jumper wire pads 38 on this surface.

In a preferred embodiment, each of the relevant signal pads on a chip 14 (i.e., a pad that carries a signal that may be involved in an engineering change) is connected to one of the engineering change pads 26 on the upper surface of the interposer. In FIG. 1, this connection is illustrated by the embedded conductor 25 that connects an outboard solder bump 18 in the drawing to an inboard engineering change pad 26. It will be appreciated that there usually are a large number of relevant chip signal pads connected to an engineering change pad located around the border of the interposer in a repeating pattern illustrated for a specific embodiment in FIG. 2.

From an inspection of FIG. 2, it will be noted that the engineering change pads 26 (identified in FIG. 2 by a X) comprise the majority of the pattern. The X or Y jumper wire pads 36 or 38 are located on the outer edge of the interposer. In this preferred embodiment it will be noted that there are two discrete half-size jumper wire pads at each location. Each discrete pad is connected to a separate X or Y conductor. In FIG. 2, the X and Y jump pads are indicated by two side-by-side empty blocks. There is a programmable input/output pad 27 in the center of the pattern. There are X-Y change pads 29 in each column that has an X jumper wire pad and, similarly, X-Y change pad 29 in each column that has a Y jumper wire pad.

As can best be seen in FIG. 3, each X-Y change pad 29 has four discrete sections. Sections 40 and 41 are connected by X plane conductors 32 to adjacent X jumper wire pads 36. Similarly, sections 42 and 43 are connected by Y plane conductors 34 to adjacent Y jumper wire pads. Each section has a notch 45 that forms a severable conducting link between the two halves of the section. To connect pad YB to pad XA in FIG. 3, a jumper wire 46 is used to connect the upper half of the section 42 to the right-hand half of section 40. The sections 40 and 42 are then cut in half by, for example, laser ablating the area of each section adjacent the notch 45 in each section. It will be appreciated that the X-Y change pad can be used to divert a wiring path on any of a number of desired directions by use of suitable jumpers and severing the appropriate section, all from the top surface of the interposer.

Figure 4A:
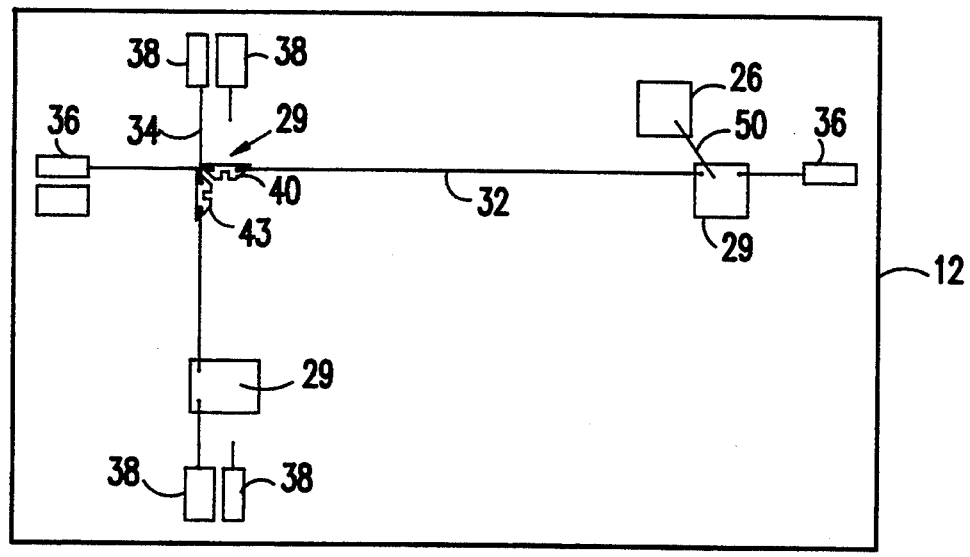
FIG. 4A is a schematic diagram illustrating X direction and Y direction engineering change wiring patterns and its connection to X and Y pads and X and Y direction change pads.
Figure 4B:
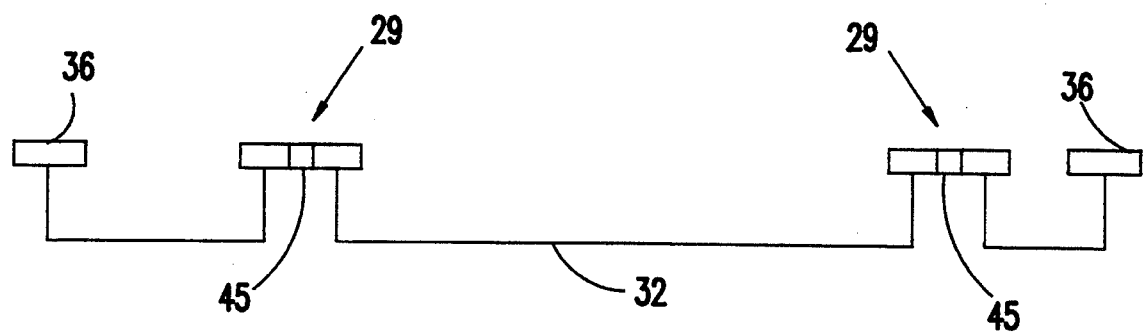
FIG. 4B illustrates schematically a single X axis conductor and its associate change pads and jumper pads. A Y axis conductor would be illustrated the same way.

FIGS. 4A illustrate schematically in a very simplified form the inter-relationship of an engineering change pad 26, the X-Y change pads 29, and the X and Y jumper wire pads 36 and 38 respectively. A jumper wire 50 connects an engineering change pad 26 to an X-Y change pad 29 in the upper right-hand corner of FIG. 4A. Depending on which side of the section 40 in pad 29 the jumper wire 46 is connected, the section can be cut at its notch 45 so that X conductor 32 couples the engineering change pad to either the pad 36 on the right-hand side of the interposer or to X-Y change pad 29 near the left-hand side of the drawing. For example, if desired, the connection can be redirected at the change pad 29 by means of a jumper wire and severing of the appropriate pad sections as explained in connection with FIG. 3. The connection can be redirected to either Y jumper pad 38 at the top of the interposer or Y jumper pad 38 at the bottom of the interposer as viewed in FIG. 4A. FIG. 4B illustrates schematically the connection in an X wiring path direction without alteration of the X-Y change pads in the path. The schematic for a Y wiring path would be the same.

A jumper wiring pad 36 or 38 at the edge of one interposer 12 can then be connected by a short jumper (e.g., jumper 46 in FIG. 1) to a jumper wiring pad 36 or 38 on the edge of an adjacent interposer 12.

Figure 5:
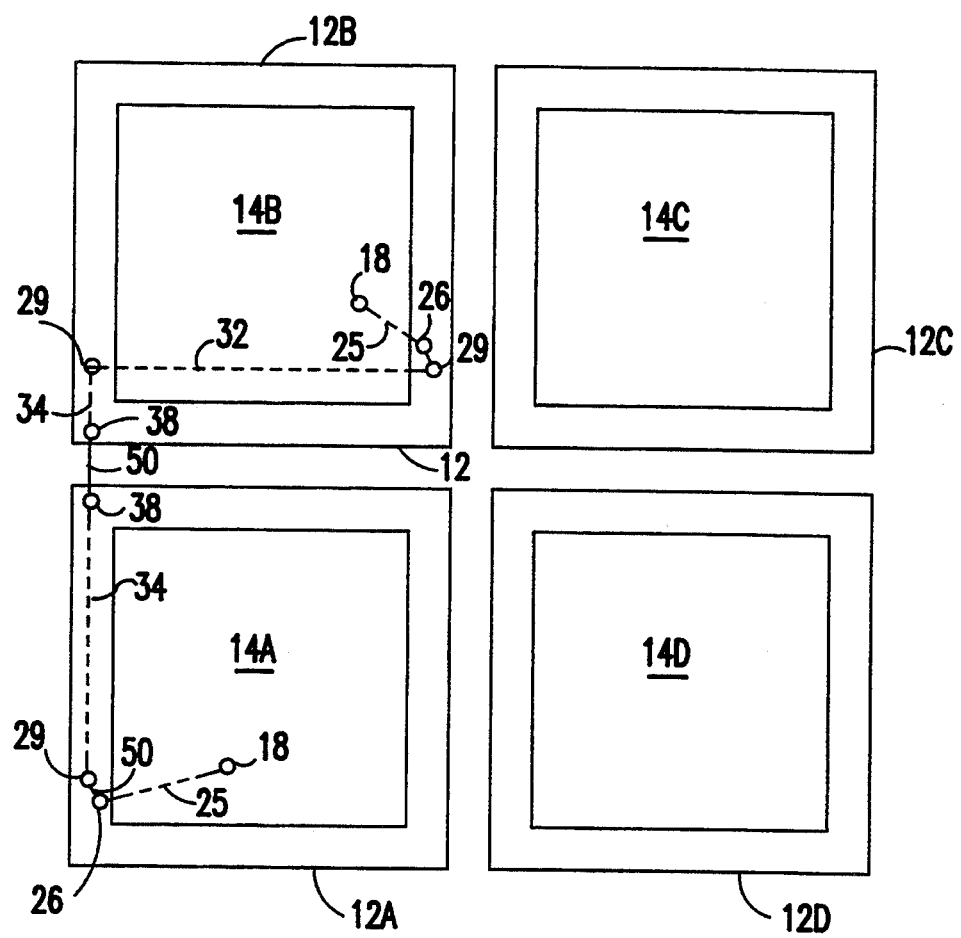
FIG. 5 is a schematic diagram illustrating how engineering changes can be routed among four chips in accordance with the teachings of this invention.

FIG. 5 illustrates how engineering changes may be routed from chip-to-chip by using a interposer in accordance with the teachings of this invention and appropriate Jumper connections. A signal I/O 18 in chip 14A is connected by a conductor 25 embedded in the interposer 12A to an engineering change pad 26 on the surface of the interposer outside the boundary of chip 14A. A jumper 50 connects pad 26 to one section of an X-Y change pad 29, and a link at notch 45 is removed so that a Y pattern conductor 34 connects the engineering change pad 26 to a jumper wire pad 38 at the top left-hand edge of interposer 12A. A jumper 46 connects pad 38 on interposer 12A to a pad 38 on interposer 12B. Change pad 29 is used to direct the connection to change pad 29 on the right-hand side of interposer 12B. A jumper connects this X-Y change pad to an engineering change pad 26 on the left side that is in turn connected by embedded conductor 25 to the desired signal I/O 18 in chip 14B.

It will be appreciated that changes can be made in a similar fashion from one chip to another by way of an intermediate chip (e.g., from 14A to 14C by way of 14B). Further changes can be made in the manner described, confined to a single chip.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A system to facilitate establishing an engineering change wiring path between one I/O pad of an integrated circuit chip mounted on a module and another I/O pad of an integrated circuit chip mounted on said module, comprising in combination:

a peripheral pattern of pads accessible from a top surface of said module, said peripheral pattern of pads including, engineering change pads, X jumper wire pads, Y jumper wire pads, and X-Y change pads;

an X wiring layer interconnecting X jumper wire pads located at opposite sides of said module and also connecting X-Y change pads in a line with said X jumper wire pads located at opposite sides of said module;

a Y wiring layer interconnecting Y jumper wire pads located at opposite sides of said module and interconnecting X-Y change pads in a line with said Y jumper wire pads at located opposite sides of said module; and wires connecting said I/O pads of an integrated circuit chip to said engineering change pads.

2. A system to facilitate establishing a engineering change wiring path as in claim 1, wherein said X-Y change pads are each comprised of four discrete sections with a removable conductive link between, in each section.

3. A system to facilitate establishing a wiring path as in claim 1, wherein said engineering change pads comprise a majority of pad in said pattern.

4. A system to facilitate establishing a wiring path as in claim 1, wherein said X jumper wire pads and said Y jumper wire pads are located at an outer peripheral edge of said pattern.

5. A system to facilitate establishing a wiring path as in claim 2, wherein said engineering change pads comprise a majority of pad in said pattern.

6. A system to facilitate establishing a wiring path as in claim 2, wherein said X jumper wire pads and said Y jumper wire pads are located at an outer peripheral edge of said pattern.

7. A system to facilitate establishing a wiring path as in claim 3, wherein said X jumper wire pads and said Y jumper wire pads are located at an outer peripheral edge of said pattern.

8. An interposer to facilitate establishing an engineering change wiring path between one I/O pad of an integrated circuit chip mounted on one interposer and another I/O pad of an integrated circuit chip mounted on another interposer, each of said interposers comprising in combination:

a peripheral pattern of pads accessible from a top surface of said interposer, said peripheral pattern of pads including, engineering change pads, X jumper wire pads, Y jumper wire pads, and X-Y change pads;

an embedded X wiring layer interconnecting X jumper wire pads located at opposite sides of said interposer and also connecting X-Y change pads in a line with said X jumper wire pads located at opposite sides of said interposer;

an embedded Y wiring layer interconnecting Y jumper wire pads located at opposite sides of said interposer and interconnecting X-Y change pads in a line with said Y jumper wire pads at located opposite sides of said interposer; and embedded wires connecting said I/O pads of an integrated circuit chip to said engineering change pads.

9. An interposer as in claim 8, wherein said X-Y change pads are each comprised of four discrete sections with a removable conductive link between, in each section.

10. An interposer as in claim 9, wherein said engineering change pads comprise a majority of pad in said pattern.

11. An interposer as in claim 10, wherein said X jumper wire pads and said Y jumper wire pads are located at an outer peripheral edge of said pattern.

* * * * *